United States Patent [19]

Hsiung et al.

[11] Patent Number: 4,691,176
[45] Date of Patent: Sep. 1, 1987

[54] ADAPTIVE CARRIER TRACKING CIRCUIT

[75] Inventors: Chia Y. Hsiung, Phoenixville; Daniel P. Ross, Philadelphia, both of Pa.

[73] Assignee: General Electric Company, Fairfield, Conn.

[21] Appl. No.: 840,220

[22] Filed: Mar. 17, 1986

[51] Int. Cl.$^4$ .............................................. H03L 7/10
[52] U.S. Cl. .......................................... 331/2; 329/50; 329/122; 329/124; 331/17; 331/25; 375/83; 375/120
[58] Field of Search ................. 331/2, 17, 25; 329/50, 329/122, 124; 375/80, 83, 94, 120

[56] References Cited

U.S. PATENT DOCUMENTS

| | | | |
|---|---|---|---|
| 4,072,905 | 2/1978 | Keelty | 329/122 |
| 4,096,360 | 6/1978 | Takahashi et al. | 329/122 X |
| 4,135,164 | 1/1979 | Kurata | 331/2 |
| 4,336,616 | 6/1982 | Carson et al. | 329/124 X |
| 4,479,091 | 10/1984 | Yoshisato | 329/122 |

Primary Examiner—Siegfried H. Grimm
Attorney, Agent, or Firm—Clement A. Berard, Jr.; Robert L. Troike

[57] ABSTRACT

An adaptive carrier tracking circuit for receiving pulse code modulated communications which have passed through a scintillation environment is disclosed. The rate and magnitude of phase or frequency fluctuations of the input signal are detected and the bandwidth of a circuit filter is adjusted in response to an estimated decorrelation time to optimize the signal tracking and bit error rate for the circuit. The adaptive carrier tracking circuit may be applied to communication systems tracking circuits utilizing phase-locked loops or modified Costas loops for phase tracking, or automatic frequency control loops for frequency tracking.

16 Claims, 6 Drawing Figures

ADAPTIVE CARRIER TRACKING CIRCUIT

BACKGROUND OF THE INVENTION

The Government has rights in this invention pursuant to Contract No. F04701-81-C-0004 awarded by the U.S. Air Force.

The present invention relates in general to communication systems and more particularly to an improved carrier tracking circuit for a pulse code modulation communication system.

Demodulators intended for both on-board and on ground satellite communications have typically used regeneration of a carrier by a phase-locked loop to demodulate an RF signal. The primary concerns in use of such a system are to maintain signal tracking and to minimize bit error rates. This involves a tradeoff. A narrow filter bandwidth in the phase-locked loop is desirable for its ability to reject large amounts of noise, thus resulting in a more stable regenerated carrier. Usually this presents no problem if the original signal is stable both as to frequency and phase. However, in a scintillation environment in which rapid fluctuations of phase or frequency occur, such as may occur during propagation of the signal through a disturbed portion of the ionosphere, a larger filter bandwidth is required to track the signal in its entirety and minimize the bit error rate.

Prior art devices provide tracking circuits having adjustable bandwidths with a wide range of values. The settings are performed manually by an operator and are based on detected signal quality. In a rapidly changing environment, manual adjustment may be too slow or too late, resulting at least in degraded performance and, at worst, in a loss of signal lock.

OBJECTS OF THE INVENTION

It is therefore a primary object of the present invention to provide a new and improved adaptive carrier tracking circuit which is not subject to the foregoing problems and disadvantages.

It is another object of the present invention to provide a carrier tracking circuit having a circuit filter with a bandwidth automatically adjustable in response to rapid fluctuations in the phase or frequency of an input carrier signal.

It is still another object of the present invention to provide an adaptive phase-locked loop having an automatically adjustable filter bandwidth.

It is a further object of the present invention to provide an adaptive carrier tracking circuit having a response time sufficiently fast to enable the circuit to adjust to an input signal which is undergoing rapid fluctuations of phase or frequency.

It is yet another object of the present invention to provide an input circuit for a phase shift keying demodulator adapted to optimize tracking and error performance in response to an input signal undergoing rapid fluctuations of phase or frequency.

SUMMARY OF THE INVENTION

The foregoing objects of the invention are achieved by the use of a new and improved adaptive carrier tracking circuit for receiving pulse code modulated communications which are propagated through a disturbed or scintillation environment before being received. By detecting the rate and magnitude of phase or frequency fluctuations of an input signal for phase or frequency tracking circuits respectively, to estimate a decorrelation time, the tracking circuit of the present invention is capable of adjusting a loop filter bandwidth to optimize signal tracking during such fluctuations and to minimize noise when the input signal is relatively stable.

The present invention may be applied to communication systems tracking loops utilizing phase-locked loops or modified Costas loops for phase tracking, or automatic frequency control (AFC) loops for frequency tracking. The basis of the present invention is that information contained in a phase or frequency error signal of a carrier tracking circuit can be used to dynamically adjust the parameters of the circuit during times of rapid phase or frequency fluctuations to optimize performance of the circuit. Either the tracking circuit itself or a secondary tracking circuit or loop is used to generate the error signal.

In a preferred embodiment of the invention, this is achieved with a phase tracking circuit by using first and second modified Costas loops coupled to the input signal. The first modified Costas loop includes a narrow bandwidth filter and operates in conjunction with a channel characteristic estimator to estimate an input signal decorrelation time and to adjust an adaptive filter bandwidth of the second modified Costas loop. The estimator detects the frequency of the input signal as well as the magnitude and rate of phase fluctuations of the input signal from the output signal of the first modified Costas loop and computes the optimum filter bandwidth for the second modified Costas loop. The baseband signal provided by the second loop is coupled to a phase shift keying demodulator. Dynamic adjustment of the bandwidth of the adaptive filter of the second modified Costas loop allows a minimized noise level or noise bandwidth, and thus a minimized bit error rate, at times when the input signal has passed through a benign environment. It also provides tracking assurance and minimized bit error rates when the signal passes through a scintillation environment. Because the response time of the estimator is short and is determined by the timing interval used, the present invention is capable of responding to phase and frequency fluctuations which are too rapid for correction by manual adjustments.

These and other objects of the present invention, together with the features and advantages thereof will become apparent from the following detailed specification, when considered in conjunction with the accompanying drawings.

DETAILED DESCRIPTION OF THE INVENTION

Figure 1:
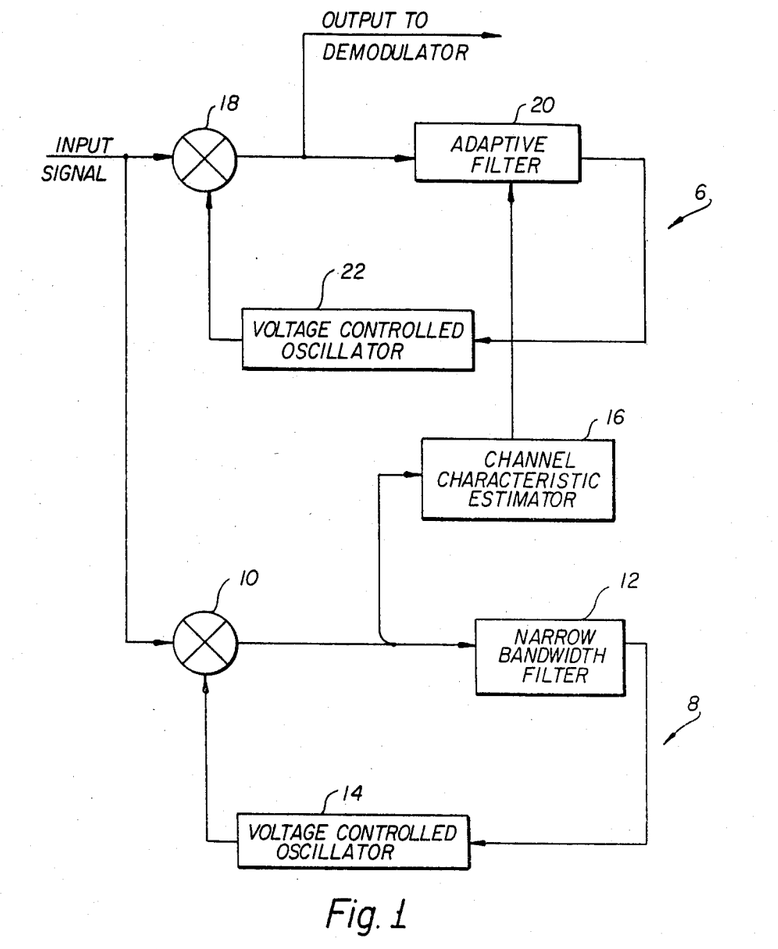
FIGS. 1 and 2 show schematic representations of the present invention for phase tracking implemented with phase-locked loops.

With reference now to the drawings, FIG. 1 shows one embodiment of an adaptive carrier tracking circuit as an adaptive phase-locked loop including first and second loops 6 and 8 respectively. Second loop 8 includes a phase detector 10 which receives an externally derived input signal and has its output which is a phase error signal coupled to a narrow bandwidth filter 12. Filter 12 provides a restoring error signal at its output which is fed to a voltage controlled oscillator 14. The latter provides a reference signal to phase detector 10 in response to the restoring error signal. The phase error signal derived at the output of phase detector 10 is proportional to the phase difference or error between the input signal and the reference signal from voltage controlled oscillator 14. The number of reversals or zero-crossings of this phase difference signal is a measure of the rate of phase fluctuations of the input signal. This phase difference signal from phase detector 10 constitutes the output signal of loop 8 and it is applied to a channel characteristic estimator 16.

Second loop 6 includes a phase detector 18 which receives the aforesaid input signal. The output of phase detector 18 is coupled to an adaptive filter 20. Filter 20 has an adjustable bandwidth and its output is coupled to a second voltage controlled oscillator 22 which provides a reference signal to phase detector 18. Adaptive filter 20 receives a control signal from estimator 16 which is capable of varying the bandwidth of filter 20. The signal derived at the output of phase detector 18 is a baseband signal of the input signal and is further fed to a demodulator which decodes the input signal.

In operation, estimator 16 and loop 8 jointly function as a detector for monitoring the characteristics of phase fluctuations and particularly the rate of fluctuations of the input signal. Adjustments are made to the bandwidth of adaptive filter 20 in response to such fluctuations in order to optimize the performance of tracking loop 6. The bandwidth selected is a function of the frequency of the input signal and of the rate and magnitude of phase fluctuations. The criterion for optimum performance is minimum noise in the output signal that is provided to the demodulator in order to minimize the bit error rate of the system. Such noise is minimized by adjusting the bandwidth of the adaptive filter to the minimum acceptable value at times when the input signal is stable.

Problems of maintaining good tracking may arise, however, when the phase of the input signal fluctuates rapidly. The correction of such problems typically requires a broader filter bandwidth. Using the root mean square (r.m.s.) average of the magnitude of phase error and the number of zero-crossings of the difference signal during a given timing interval, which may be on the order of about one second, estimator 16 computes a decorrelation time which is a measure of the rate of fluctuations of a given magnitude. An optimum filter bandwidth for adaptive filter 20 is determined based on the computed decorrelation time. The algorithm for determining the filter bandwidth from the decorrelation time uses statistical data for the particular tracking loop involved.

Estimator 16 adjusts the adaptive filter bandwidth such that, for decorrelation times greater than a given predetermined value $t_{max}$, a minimum bandwidth is set. For decorrelation times less than a given predetermined value $t_{min}$, the maximum adaptive filter bandwidth is set. For decorrelation times between $t_{min}$ and $t_{max}$, the loop bandwidth is varied between the minimum and maximum values such that optimum tradeoff between trackability and minimum noise results. The available values of the adjusted bandwidth may be along a continuum, or they may be discrete values. The bandwidth of the adaptive filter may be varied by adjusting the values of resistors and capacitors comprising the filter. Alternatively, or as a supplement, the gain of phase detector 18, or of voltage controlled oscillator 22, may be adjusted.

Figure 2:
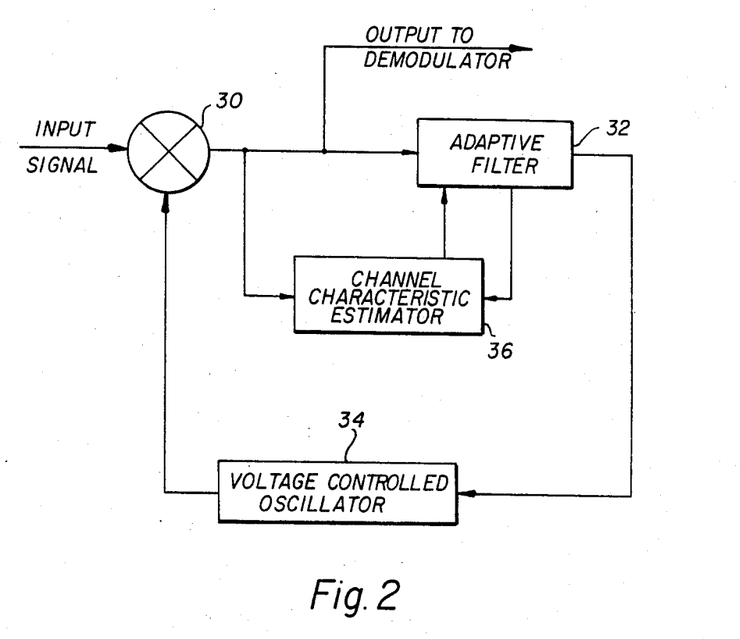

A second embodiment of the adaptive carrier tracking circuit as an adaptive phase-locked loop is shown schematically in FIG. 2 and is seen to consist of a single loop. This loop includes a phase detector 30 which provides a phase error signal at its output. The latter output is coupled to an adaptive filter 32 which, in turn, has its output coupled to a voltage controlled oscillator 34. Oscillator 34 receives a restoring error signal from adaptive filter 32 and provides a responsive reference signal to phase detector 30. A channel characteristic estimator 36 is connected to the output of phase detector 30.

Rather than measuring the tracking error characteristics closely related to the input signal, as is the case in the embodiment shown in FIG. 1, the embodiment illustrated in FIG. 2 adjusts the adaptive filter bandwidth based on computational algorithms utilizing measurements of the characteristics of the output signal and the present setting of the adaptive circuit. While such an arrangement requires fewer components for the adaptive carrier tracking circuit than the embodiment of FIG. 1, estimator 36 must factor in that the tracking errors of the measured signal of the adaptive circuit are smaller than those used to measure the characteristics in the embodiment of FIG. 1. This is because the dynamic adjustment of the filter bandwidth affects loop performance to reduce tracking errors.

Figure 3:
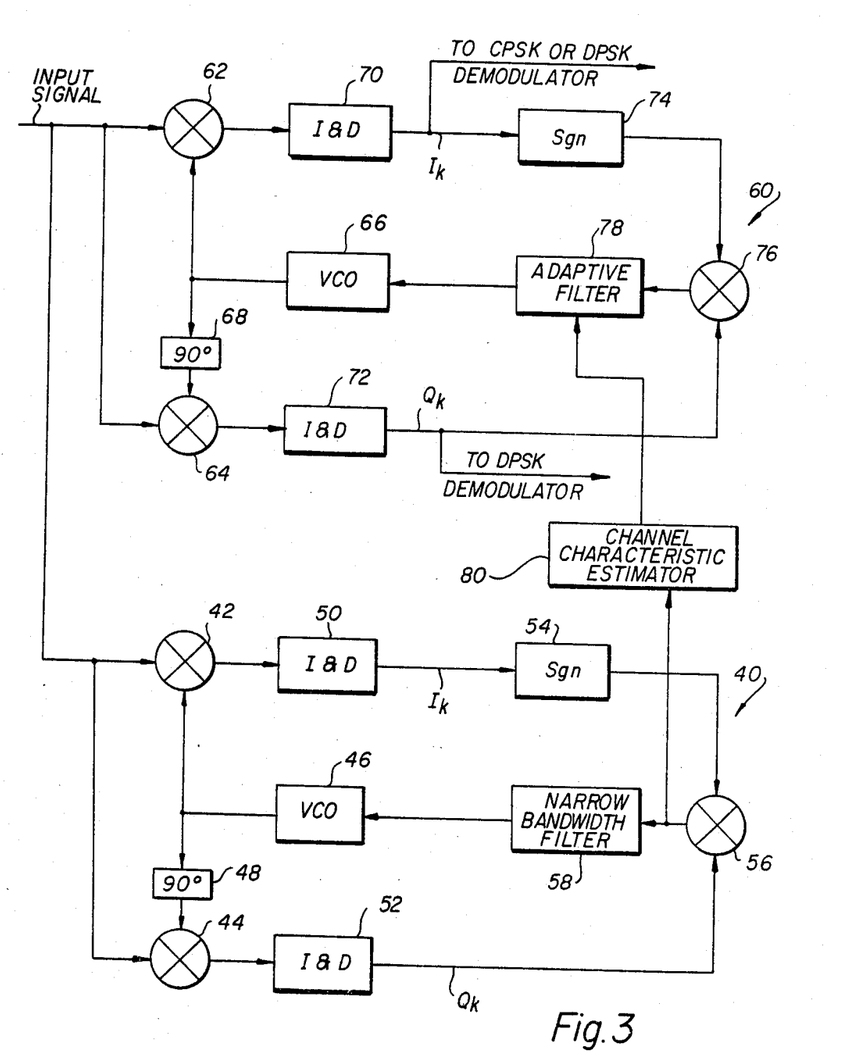
FIG. 3 shows a schematic representation of the present invention for phase tracking implemented with modified Costas loops.

FIG. 3 illustrates an embodiment of the present invention employing the adaptive carrier tracking circuit techniques for an input circuit of the type used with either a coherent phase shift keying (CPSK) demodulator, or a differential phase shift keying (DPSK) demodulator. The present embodiment uses first and second modified Costas loops, designated 40 and 60 respectively. A modified Costas loop includes an integrate-and-dump circuit following each of the two input mixers. First loop 40 includes a pair of mixers 42 and 44, both of which are coupled to receive the input signal. A voltage controlled oscillator 46 provides an inphase reference signal at its output which is coupled to mixer 42. A 90° phase-shift element 48 is further coupled to the output of oscillator 46 and provides a quadrature reference signal to mixer 44. The outputs of mixers 42 and 44 of loop 40 are coupled to integrate-and-dump circuits 50 and 52 respectively, which function as low pass filters for the signals derived at the mixer outputs. Circuit 50 is followed by a signum (Sgn) element 54 which provides an output of ±one, depending on whether the signal it receives is greater or less than zero. A mixer 56 is coupled to receive inputs from element 54 and circuit 52. Mixer 56 provides a phase error signal at its output which is a product of the signals received at its inputs. A narrow bandwidth filter 58 is coupled to the output of mixer 56 and provides a restoring error signal to voltage controlled oscillator 46.

Loop 60 is configured essentially the same as loop 40. A pair of mixers 62 and 64 receive the input signal and they are followed by a pair of integrate-and-dump circuits 70 and 72 respectively. A voltage controlled oscillator 66 provides an inphase reference signal to mixer 62 and, through a 90° phase-shift element 68, a quadrature reference signal to mixer 64. Circuit 70 is followed by a Sgn element 74 and its output is mixed with the output of circuit 72 by means of a mixer 76 to provide a phase error signal. An adaptive filter 78 receives the phase error signal from mixer 76 and provides a restoring error signal to oscillator 66. A channel characteristic estimator 80 is coupled between the output of mixer 56 and adaptive filter 78 and provides a control signal for varying the bandwidth of filter 78.

Figure 5:
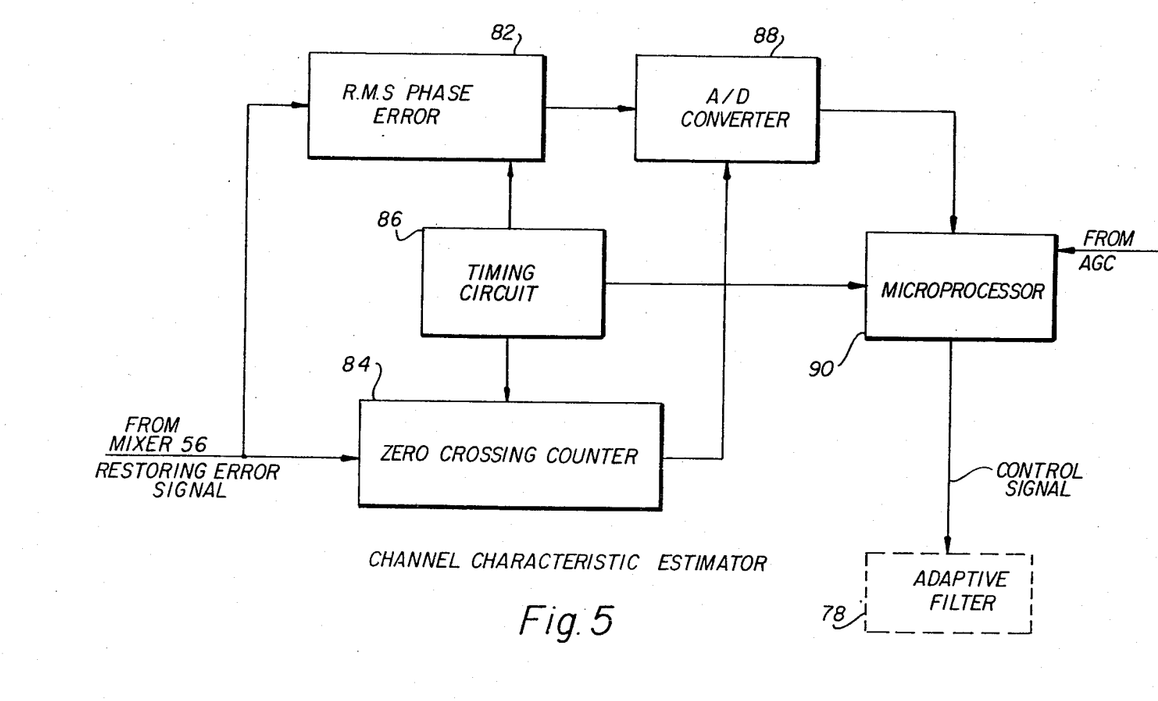
FIG. 5 is a schematic representation of the channel characteristic estimator used in the embodiments of FIGS. 1–4.

FIG. 5 illustrates a channel characteristic estimator, such as is shown in each of FIGS. 1-4, in greater detail. For purposes of explanation, the channel characteristic estimator is discussed here with reference to estimator 80 shown in FIG. 3. However, it will be understood that its structure is essentially the same for each embodiment, the principal difference between them being the algorithm used for the calculation of the control signal. As shown, the signal derived at the output of mixer 56 is applied to a circuit for calculating the r.m.s. phase error 82 and to a zero crossing counter 84. A timing circuit 86 is coupled to calculating circuit 82 and to counter 84 to control the sampling or timing interval. The outputs of calculating circuit 82 and of counter 84 are fed to an analog-to-digital converter 88, which in turn is coupled to a microprocessor 90. Timing circuit 86 is coupled to microprocessor 90, which additionally receives a signal from an external automatic gain control (AGC) circuit. Microprocessor 90 provides a computed control signal at its output for varying the bandwidth of adaptive filter 78.

In operation, loop 40 (FIG. 3), which includes narrow bandwidth filter 58, functions as a detector for tracking errors, its output signal being fed to estimator 80. The information in the aforesaid loop output signal includes data concerning the frequency of the input signal, as well as rate and magnitude of phase variations of this signal over a given sampling period. A decorrelation time is estimated by microprocessor 90 and, based on this data, an optimum bandwidth for the particular circuit is calculated to provide a minimum bit error rate.

Referring again to the embodiment of FIG. 3, the input signal, $A(t) \cos \theta_I(t)$, is adjusted by the AGC circuit before being fed to the carrier tracking circuit. This input signal is mixed with the inphase reference signals from voltage controlled oscillators 46 and 66 by means of mixers 42 and 62 respectively. The input signal is further mixed with the quadrature reference signals from phase-shift elements 48 and 68 by means of mixers 44 and 64 respectively. The mixer products are filtered by integrate-and-dump circuits 50, 52, 70 and 72 which follow mixers 42, 44, 62 and 64, respectively. The output signals of circuits 50 and 70 constitute inphase samples $I_k$ of the baseband signal. The outputs of circuits 52 and 72 constitute quadrature samples $Q_k$ of the baseband signal. These samples may be represented by the following relationships:

$$I_k = A(t_k) \cos \phi_k$$

$$Q_k = A(t_k) \sin \phi_k$$

where $t_k$ = Current Time Sample $k$ = Index of Current Time Sample, $t_k$.

The value of $\phi_k$ is defined as the phase error at $t_k$ and equals the difference between the input signal phase $\theta_I(t_k)$ and the voltage controlled oscillator reference signal phase $\theta_R(t_k)$.

The phase error signal $e_k$ which drives each voltage controlled oscillator is represented by:

$$e_k = Q_k \text{Sgn}(I_k).$$

The value of the phase error signal is related to the frequency of the input signal and to the rate and magnitude of phase variations of the input signal over a given sampling time. Estimator 80 uses the information contained in the restoring error signal from loop 40 to estimate the input signal decorrelation time and to calculate an optimum bandwidth for adaptive loop filter 78. The r.m.s. phase error averaged over the timing interval is estimated from the phase error signal by calculating means 82 (FIG. 5). The periodicity of the phase error is determined from the phase error signal by zero crossing counter 84 (FIG. 5) for the same timing interval. It should be noted here that the timing interval provided by timing circuit 86 (FIG. 5) is adjustable and is set based on the rate of fluctuations anticipated for a given circuit application. A typical timing interval may be on the order of one second. The data described above is provided to microprocessor 90 (FIG. 5) via analog-to-digital converter 88 (FIG. 5), along with an address to identify the particular timing interval involved. Microprocessor 90 then calculates the average magnitude of phase error and interval of phase fluctuations and computes a bandwidth for adaptive filter 78 to provide optimum performance for the signal conditions existing during the timing interval. In making the calculation, microprocessor 90 also takes into consideration any adjustments made to the input signal by the AGC circuit. This prevents erroneous adjustments of the adaptive filter bandwidth where the input signal is of a very low magnitude as compared to the noise level.

Figure 4:
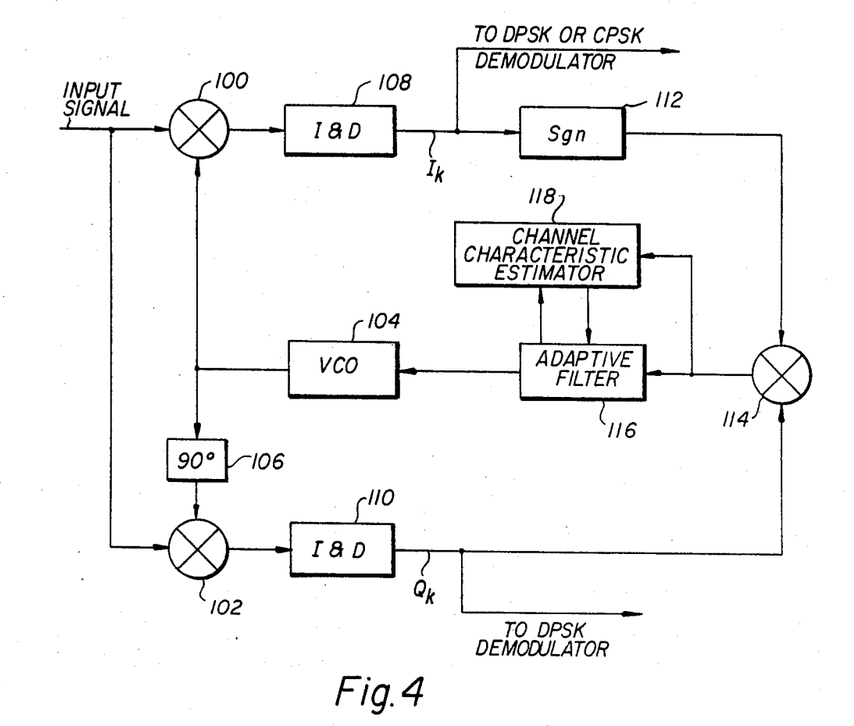
FIG. 4 shows another embodiment of the present invention for phase tracking implemented with modified Costas loop.

A second configuration of the adaptive carrier tracking circuit which uses a modified Costas loop is shown in FIG. 4. The input signal is fed to a pair of mixers 100 and 102. A voltage controlled oscillator 104 provides an inphase reference signal to mixer 100 and, through 90° phase-shift element 106, a quadrature reference signal to mixer 102. The outputs of mixers 100 and 102 are coupled to integrate-and-dump circuits 108 and 110 respectively. The output of circuit 108 is fed to Sgn element 112. The signal derived at the output of element 112 is coupled to a mixer 114 along with the output signal of circuit 110. The restoring error signal derived at the output of mixer 114 is coupled to an adaptive filter 116 which has an adjustable bandwidth.

A channel characteristic estimator 118 is also coupled to the output of mixer 114 and receives the phase error signal. Filter 116 provides a filtered restoring error signal to a voltage controlled oscillator 104. Estimator 118 provides a control signal to filter 116 adapted to vary its bandwidth. Filter 116 is further coupled to the microprocessor of estimator 118 to provide the current setting of the adaptive filter bandwidth.

The tracking circuit shown in FIG. 4 functions analogously to the embodiment of FIG. 2 in that channel characteristic estimator 118 uses the phase error signal from the tracking loop for providing input signal phase fluctuation information. An inphase sample $I_k$ of the baseband signal is provided at the output of circuit 108 and a quadrature sample $Q_k$ of the baseband signal is provided at the output of circuit 110. Mixer 114 then provides the phase error signal $e_k$ as a product of the quadrature sample with the sign of the inphase sample as shown by the following relationship:

$$e_k = Q_k \, \text{Sgn} \, (I_k).$$

This error signal is used by estimator 118 to determine the optimum bandwidth for adaptive filter 116. The most recent bandwidth setting of filter 116 is used by the microprocessor of estimator 118 since that bandwidth setting affects the circuit tracking performance.

Figure 6:
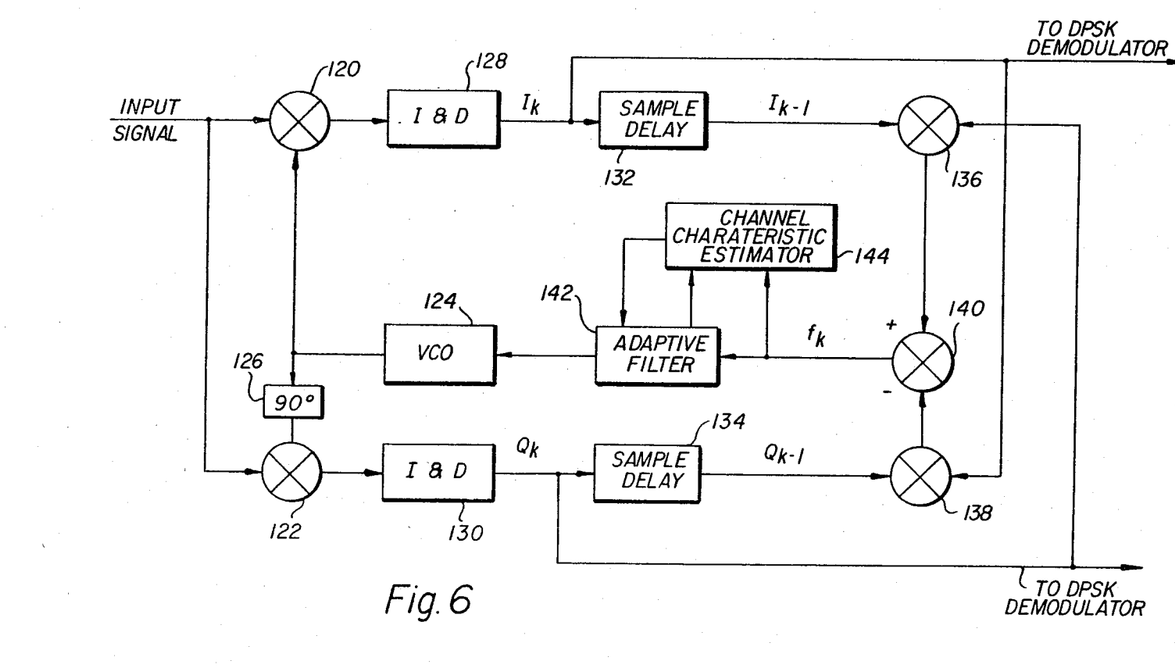
FIG. 6 shows a schematic representation of the present invention for frequency tracking implemented with an automatic frequency control loop.

The present invention can also be used with a carrier tracking circuit which utilizes frequency tracking of the input signal, as shown in FIG. 6. In this embodiment, the frequency error signal $f_k$ of an automatic frequency control (AFC) circuit is used for determining input signal fluctuation characteristics. The AFC circuit includes a pair of mixers 120 and 122 coupled to receive the input signal. A voltage controlled oscillator 124 provides an inphase reference signal at its output which is coupled to mixer 120. A 90° phase-shift element 126 is further coupled to the output of oscillator 124 and provides a quadrature reference signal to mixer 122. The signals provided at the outputs of mixers 120 and 122 are inphase sample $I_k$ and quadrature sample $Q_k$ of the baseband signal which are coupled to a pair of integrate-and-dump circuits 128 and 130 respectively. The integrate-and-dump circuits function as low pass filters for the inphase and quadrature samples derived at the mixer outputs.

Circuits 128 and 130 are followed by sample delay elements 132 and 134 respectively, which provide time delayed inphase sample $I_{k-1}$ and time delayed quadrature sample $Q_{k-1}$ respectively. A mixer 136 is coupled to receive the delayed inphase sample $I_{k-1}$ from element 132 and the quadrature sample $Q_k$ from the output of circuit 130. A mixer 138 is coupled to receive the time delayed quadrature $Q_{k-1}$ sample from element 134 and the inphase sample $I_k$ from the output of circuit 128. A difference mixer 140 is coupled to the outputs of mixers 136 and 138 to provide a frequency error signal which represents the difference of the signals from mixers 136 and 138 such that:

$$f_k = Q_k I_{k-1} - I_k Q_{k-1}$$

where $f_k$ is the frequency error signal.

An adaptive filter 142, having an adjustable bandwidth, is coupled to receive the frequency error signal and provide a restoring error signal to oscillator 124. A channel characteristic estimator 144 is coupled to receive the frequency error signal and provide a responsive control signal for varying the bandwidth of adaptive filter 142. Estimator 144 functions in essentially the same manner as the estimator shown in FIG. 5 for use with phase tracking circuits, except that it measures the rate and magnitude of frequency fluctuations of the input signal.

The output signal of the AFC circuit is either the inphase sample $I_k$ from the output of circuit 128 or the quadrature sample $Q_k$ from the output of circuit 130. This signal is applied to a phase shift keying demodulator.

An alternative embodiment of the present invention for frequency tracking, not shown, employs a second AFC circuit as a detector to provide the frequency error signal to the channel characteristic estimator. This embodiment is comparable to the phase tracking embodiment shown in FIG. 3.

The adaptive carrier tracking circuit has been described with reference to phase or frequency tracking of a pulse code modulated input signal and a phase shift keying demodulator. However, the present invention may be used with demodulators for other kinds of modulated signals such as, for example, coherent amplitude detectors, phase demodulators and frequency demodulators. Additionally, the present invention may be used where the source of tracking errors is other than a scintillation environment such as, for example, a changing doppler shift environment of a moving platform.

While the present invention has been shown and described with reference to a preferred embodiment, it will be understood that numerous modifications, changes, variations, substitutions and equivalents will now occur to those skilled in the art without departing from the spirit and scope of the present invention. Accordingly, it is intended that the invention herein be limited only by the scope of the appended claims.

What is claimed is:

1. A adaptive carrier tracking circuit comprising:
 a first phase-locked loop including a first phase detector responsive to an externally derived input signal and to a first reference signal, the first phase-locked loop for providing a first error signal and having an output coupled to a narrow bandwidth filter, wherein the first error signal is indicative of the frequency, and the magnitude and rate of phase fluctuations of the input signal and the narrow bandwidth filter for providing a first restoring error signal;
 a second phase-locked loop including a second phase detector responsive to said input signal and to a second reference signal, the second phase-locked loop hacing an output constituting an output of the adaptive carrier tracking circuit coupled to an adaptive filter of adjustable bandwidth, the adaptive filter for providing a second restoring error signal;
 channel characteristic estimator having an input coupled to said output of said first phase detector for providing a control signal in response to the frequency of said input signal and the magnitude and the rate of phase fluctuations of said input signal;
 first reference signal generating means coupled to the first phase detector and the narrow bandwidth filter for supplying the first reference signal in response to the first restoring error signal; and
 second reference signal generating means coupled to the second phase detector and the adaptive filter for supplying the second reference signal in response to the second restoring error signal,
 said adaptive filter being responsive to said control signal to vary said adjustable bandwidth;
 whereby said adaptive filter bandwidth varies in response to variations of the frequency, magnitude and rate of phase fluctuations of the input signal to optimize the performance of said circuit.

2. The adaptive carrier tracking circuit of claim 1, wherein said first and second reference signal generating means include a respective first and second voltage controlled oscillator.

3. An adaptive carrier tracking circuit, comprising:

a first phase-locked loop including a first phase detector and a first voltage controlled oscillator/(VCO), the first phase detector responsive to an externally derived input signal and having an output for supplying a phase error signal, indicative of characteristics of the externally derived input signal, coupled to an input of the first VCO, and the first VCO having an output for supplying a first reference signal coupled to an input of the first phase detector;

a second phase-locked loop including a second phase detector, an adaptive filter having a variable bandwidth and a second VCO, the second phase detector responsive to the externally derived input signal and having an output coupled to an input of the adaptive filter, the adaptive filter having an output coupled to an input of the second VCO and the second VCO having an output for supplying a second reference signal coupled to an input of the second phase detector; and a channel characteristic estimator having an input coupled to the output of the first phase detector and an output coupled to another input of the adaptive filter, the channel characteristic estimator for providing a control signal to the adaptive filter for controlling the bandwidth of the adaptive filter in response to the externally derived input signal.

wherein the output of the second phase detector consititutes the output of the adaptive carrier tracking circuit.

4. The adaptive carrier tracking circuit of claim 3, wherein said channel characteristic estimator comprises:

calculating means having an input and an output, the input coupled to the output of said first phase detector, the calculating means for calculating the root mean square magnitude of the phase error signal during a predetermined sampling interval;

a zero crossing counter having an input and an output, the input coupled to the output of said first phase detector, the zero crossing counter for determining the periodicity of phase fluctuations of the phase error signal during the sampling interval, wherein phase fluctuations of the phase error signal are representative of phase fluctuations of said input signal; and a microprocessor having a respective input coupled to the output of the calculating means and the zero crossing counter and including an output constituting the output of the characteristic estimator for providing said control signal, said microprocessor being adapted to estimate a decorrelation time of said input signal and to control the adaptive filter bandwidth for providing optimum performance of said adaptive carrier tracking circuit for input signal conditions existing during said sampling interval.

5. An adaptive phase-locked loop comprising:

a voltage controlled oscillator (VCO) responsive to a restoring error signal for providing a reference signal at an output of the VCO;

a phase detector having an input coupled to the output of the VCO, the phase detector responsive to an externally derived input signal and to said reference signal for providing a difference signal at an output of the phase detector, the difference signal representative of the phase difference between said externally derived input and reference signals and indicative of the frequency, and rate and magnitude of phase fluctuations of the externally derived input signal;

a channel characteristic estimator having an input coupled to the output of the phase detector, the channel characteristic estimator responsive to said difference signal for providing a control signal based upon the frequency of said externally derived input signal and on the rate and magnitude of phase fluctuations of said externally derived input signal; and an adaptive loop dilter having an input coupled to the phase detector for receiving the difference signal and an output coupled to an input of the voltage controlled oscillator for supplying the restoring error signal in response to the difference signal, the adaptive loop filter further having another input coupled to the channel characteristic estimator for receiving the control signal, the adaptive loop filter responsive to said control signal for varying the bandwidth of the adaptive filter, wherein the output of the adaptive phase-locked loop is available at the output of the phase detector, and whereby the bandwidth of said adaptive filter is adjusted in response to said frequency and to said rate and magnitude of phase fluctuations of said externally derived input signal to optimize the performance of said adaptive phase-locked loop.

6. An input circuit for a phase shift keying demodulator, the input circuit responsive to an externally derived input signal, said input circuit comprising:

a first loop including:

first reference signal generating means having an input and an output for supplying a first reference signal;

first mixer means having an input for receiving the first reference signal coupled to the output of the first reference signal generating means and an output;

second mixer means having an input for receiving a phase shifted first reference signal coupled to the output of the first reference signal generating means and an output;

first and second low pass filter means having a respective output for supplying a respective filtered signal and a respective input coupled to the output of the first and second mixer means, respectively;

first signal means coupled to the output of the first low pass filter means for determining the sign of the filtered signal provided thereto; and third mixer means having a respective input coupled to the first sign means for receiving an indication of the sign of the filtered signal provided to the first sign means and to the output of the second low pass filter means and an output coupled to the input of the first reference signal generating means;

a second loop including:

second reference signal generating means having an input and an output for supplying the second reference signal;

fourth mixer means having an input for receiving the second reference signal coupled to the output of the second reference signal generating means and an output;

fifth mixer means having an input for receiving a phase shifted second reference signal coupled to the output of the second reference signal generating means and an output;

said first, second, fourth, and fifth mixer means each having a second input for receiving said externally derived input signal;

third and fourth low pass filter means having a respective output for supplying a respective filtered signal and a respective input coupled to the output of the fourth and fifth mixer means, respectively;

second sign means coupled to the output of the third low pass filter means for determining the sign of the filtered signal provided thereto;

sixth mixer means having a respective input coupled to the second sign means for receiving an indication of the sign of the filtered signal provided to the second sign means and to the output of the fourth low pass filter means and an output coupled to the input of the second reference signal generating means;

adaptive filter means having a variable bandwidth, the adaptive filter means having an input coupled to the output of the sixth mixer means and an output coupled to the input of the second reference signal generating means; and a channel characteristic estimator having an input coupled to the output of the third mixer means and an output coupled to another input of the adaptive filter means, the estimator for supplying a control signal for controlling the bandwidth of the adaptive filter, wherein the outputs of the third and fourth low pass filter means constitute respective outputs of the input circuit whereby the bandwidth of said adaptive filter is selected by said estimator to optimize the tracking and error performance of said input circuit.

7. The input circuit of claim 6, wherein said estimator includes:

calculating means having an output, and an input coupled to the output of said third mixer means, the calculating means for calculating the root mean square magnitude of the phase error signal during a predetermined sampling interval;

a zero crossing counter having an output, and an input coupled to the output of said third mixer means, the zero crossing counter for determining the periodicity of phase fluctuations of the phase error signal during the sampling interval, wherein phase fluctuations of the phase error signal are representative of phase fluctuations of said input signal;

a microprocessor having a respective input coupled to the output of the calculating means and the zero crossing counter and including an output constituting the output of the estimator for providing the control signal to said adaptive filter, said microprocessor being adapted to compute said adaptive loop filter bandwidth from a decorrelation time estimate based on data from said calculating means and from said counter to provide optimum performance of said input circuit.

8. The input circuit of claim 7 wherein the amplitude of said input signal is adjusted by an automatic gain control circuit to maintain a constant input circuit gain, said automatic gain control circuit being coupled to said microprocessor to provide information concerning input signal amplitude adjustments;

whereby erroneous adjustments to said adaptive filter bandwidth in response to a low magnitude input signal are avoided.

9. An input circuit for a phase shift keying demodulator responsive to an externally derived input signal having a rapidly fluctuating phase, said input signal including a carrier signal and a baseband signal;

said input circuit comprising:

a voltage controlled oscillator for providing a reference signal at its output;

a first mixer coupled to receive said input signal, said first mixer being further coupled to said output of said voltage controlled oscillator to receive said reference signal and being adapted to provide an inphase difference signal representative of any phase difference between said received signals;

a second mixer coupled to receive said input signal;

means coupled between the output of said voltage controlled oscillator and said second mixer for shifting the phase of said reference signal by 90°;

said second mixer being adapted to provide a quadrature difference signal representative of any phase difference between said input signal and said phase shifted reference signal;

first and second integrate-and-dump circuits coupled to the outputs of said first and second mixers respectively, said last-recited first and second circuits being adapted to provide low pass filtering of said inphase and quadrature difference signals respectively, to produce inphase and quadrature samples of said baseband signal;

means coupled to said first circuit for detecting the sign of said inphase sample and for providing a sign signal representative thereof;

a third mixer coupled to the output of said second circuit and of said sign detecting means to provide a restoring error signal at said third mixer output as a product of said quadrature sample and of said sign signal;

an adaptive filter coupled between the output of said third mixer and the input of said voltage controlled oscillator, said filter having an adjustable bandwidth; and a channel characteristic estimator coupled between the output of said third mixer and said adaptive filter, said estimator being adapted to detect the frequency of said restoring error signal and the magnitude and rate of phase fluctuation of the latter signal and to adjust said adaptive filter bandwidth in response thereto;

whereby the performance of said input circuit is optimized.

10. An adaptive carrier tracking circuit comprising:

an adaptive filter having an adjustable bandwidth and responsive to a first error signal;

a voltage controlled oscillator for providing a first reference signal coupled to the output of said adaptive filter;

first error means for providing the first error signal as a function of the difference in phase or frequency between an externally derived input signal and the first reference signal;

means for generating a second reference signal in response to a second error signal;

second error means for providing the second error signal as a function of the difference in phase or frequency between the externally derived input signal and said second reference signal; and means for estimating the rate of fluctuations of said input signal as a function of variations of said second error signal, said estimating means providing an output signal being adapted to adjust the bandwidth of said adaptive filter;

whereby the tracking and noise performance of said circuit is optimized.

11. The adaptive carrier tracking circuit of claim 10, wherein said second error signal is a function of the phase difference between said input signal and said second reference signal;

said first error means including:
a first phase detector coupled to the output of said voltage controlled oscillator and having an output coupled to said adaptive filter for supplying the first error signal, thereby forming a first phase-locked loop; and said second error means including:
a second phase detector having an input for receiving the second reference signal coupled to the means for generating and an output for supplying the second error signal coupled to the means for generating, thereby forming a second phase-locked loop.

12. An adaptive carrier tracking circuit, comprising:
an adaptive filter having a bandwidth adjustable in response to an estimation signal and an output for providing a restoring error signal in response to a first phase error signal;
first reference means for generating a first reference signal in response to the restoring error signal and an output for supplying the first reference signal;
first error means for providing a first and second error signal, the first error means coupled to the output of the first reference means, wherein said first and second error signal is a function of the phase difference between an externally derived input signal having a baseband and said first reference signal;
first mixer means coupled to the first error means for providing the first phase error signal to the adaptive filter in response to the sign of the first error signal and the second error signal;
second reference means for generating a second reference signal in response to a second phase error signal and having an output for supplying the second reference signal;
second error means for providing a third and fourth error signal, the second error means coupled to the output of the second reference means, wherein said third and fourth error signal is a function of the phase difference between the externally derived input signal having a baseband and said second reference signal;
second mixer means coupled to the second error means for providing the second phase error signal to the second reference means in response to the sign of the third error signal and the fourth error signal; and
estimating means having an output coupled to the adaptive filter and an input coupled to the second mixer means, the estimating means for controlling the bandwidth of the adaptive filter in response to the second phase error signal.

13. An adaptive carrier tracking circuit, comprising;
an adaptive filter having a bandwidth adjustable in response to an estimation signal and an output;
reference means for generating a reference signal having an input coupled to the output of the adaptive filter and having an output for supplying the reference signal;

first error means for providing a first error signal, the first error means coupled to the output of the reference means, wherein said first error signal is a function of the phase difference between an externally derived input signal having a baseband and said reference signal;
quadrature means for providing a quadrature sample of the baseband of said input signal;
signum means for providing a signum signal of an inphase sample of the baseband of said input signal;
second error means for providing a second error signal in response to said quadrature sample and said signum signal and having an output coupled to said adaptive filter to form a modified Costas loop; and
estimating means for estimating the rate of fluctuations of the input signal as a function of variations of the first error signal, the estimating means coupled to the adaptive filter for supplying the estimation signal in response to variations of the first error signal.

14. An adaptive carrier tracking circuit for processing an input signal having a baseband component, comprising:
an adaptive filter having a variable bandwidth and an output for supplying a restoring error signal in response to a frequency error signal;
a voltage controlled oscillator (VCO) having an input coupled to the output of the adaptive filter and an output for supplying a reference signal in response to the restoring error signal;
first sampling means coupled to the output of the VCO for providing a quadrature sample of the baseband of said input signal in response to the input signal and a phase shifted component of the reference signal;
first sample delay means coupled to the output of said first sampling means, the first sample delay means for providing a time delayed quadrature sample of said baseband;
second sampling means coupled to the output of the VCO for providing an inphase sample of said baseband in response to the input signal and the reference signal;
second sample delay means coupled to the output of said second sampling means, the second sample delay means for providing a time delayed inphase sample of said baseband;
a first signal mixer coupled to said first sampling means and said second sample delay means for receiving said quadrature sample and said time delayed inphase sample;
a second signal mixer coupled to said second sampling means and said first sample delay means for receiving said inphase sample and said time delayed quadrature sample; a signal difference mixer coupled to receive output signals from said first and second mixers and having an output coupled to an input of said adaptive filter for supplying the frequency error signal to said adaptive filter; and
estimating means having an input coupled to the output of said signal difference mixer and an output coupled to another input of said adaptive filter, said estimating means for varying the bandwidth of said adaptive filter in response to the frequency error signal.

15. The adaptive carrier tracking circuit of claim 14, wherein second sampling means includes a third signal mixer having an output and a first integrate-and-dump circuit having an input coupled to the output of the third signal mixer, said third mixer being coupled to receive said input signal and said reference signal; and further wherein said first sampling means includes a fourth signal mixer having an input for receiving the phase shifted component of the reference signal and an output, a second integrate-and-dump circuit having an input coupled to the output of the fourth signal mixer and phase-shifting means coupled between the output of the VCO and the first sampling means for shifting the reference signal 90° for providing the phase shifted component of the reference signal; and said fourth mixer being coupled to receive said input signal.

16. The adaptive carrier tracking circuit of claim 14, wherein the estimating means includes means for determining rate and magnitude of frequency fluctuations of the input signal so that the bandwidth of the adaptive filter is varied in response to the rate and magnitude of frequency fluctuations of the input signal.

* * * * *

UNITED STATES PATENT AND TRADEMARK OFFICE
CERTIFICATE OF CORRECTION

PATENT NO. : 4,691,176

DATED : September 1, 1987

INVENTOR(S) : Chia Y. Hsiung and Daniel P. Ross

It is certified that error appears in the above-identified patent and that said Letters Patent is hereby corrected as shown below:

Column 8, line 39, "hacing" should be --having--.

Column 8, line 44, insert "a" before channel.

Column 10, line 12, "dilter" should be --filter--.

Signed and Sealed this

Twenty-third Day of February, 1988

Attest:

DONALD J. QUIGG

*Attesting Officer*  *Commissioner of Patents and Trademarks*